(12) United States Patent
Verma et al.

(10) Patent No.: US 11,676,992 B2
(45) Date of Patent: Jun. 13, 2023

(54) INDUCTOR MODULE AND METHOD FOR FABRICATING THE SAME

(71) Applicant: UNITED MICROELECTRONICS CORPORATION, Hsinchu (TW)

(72) Inventors: Purakh Raj Verma, Singapore (SG); Su Xing, Singapore (SG); Shyam Parthasarathy, Singapore (SG); Xiao Yuan Zhi, Singapore (SG)

(73) Assignee: UNITED MICROELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 17/105,524

(22) Filed: Nov. 26, 2020

(65) Prior Publication Data

US 2022/0069064 A1 Mar. 3, 2022

(30) Foreign Application Priority Data

Sep. 2, 2020 (CN) .......................... 202010908104.8

(51) Int. Cl.
*H01L 21/768* (2006.01)
*H01L 49/02* (2006.01)

(52) U.S. Cl.
CPC ........ *H01L 28/10* (2013.01); *H01L 21/76831* (2013.01); *H01L 21/76832* (2013.01); *H01L 21/76897* (2013.01)

(58) Field of Classification Search
CPC ......... H01L 21/76831; H01L 21/76832; H01L 21/76897; H01L 28/10; H01L 23/5227
See application file for complete search history.

(56) References Cited

U.S. PATENT DOCUMENTS

| | | | | |
|---|---|---|---|---|
| 2004/0195652 | A1* | 10/2004 | Okada | H01L 23/5227 257/E21.022 |
| 2008/0173975 | A1* | 7/2008 | Chen | H01L 27/2463 257/E21.003 |
| 2014/0231955 | A1 | 8/2014 | Hsueh et al. | |
| 2020/0105860 | A1* | 4/2020 | Akcasu | H01L 21/3065 |

* cited by examiner

*Primary Examiner* — Thanhha S Pham (57) ABSTRACT

An inductor module and a method for fabricating the same are disclosed. The inductor module includes a substrate, a first inter-level dielectric layer, a plurality of second inter-level dielectric layers, a trench, and a first metal layer. The first inter-level dielectric layer is disposed on the substrate. The second inter-level dielectric layers are sequentially stacked on the first inter-level dielectric layer. The trench is disposed to penetrate at least two of the second inter-level dielectric layers. The first metal layer is disposed in the trench. The first metal layer has a top side surface and a bottom side surface opposite to each other. The top side surface is coplanar with an upper surface of the trench in the second inter-level dielectric layers. The bottom side surface is coplanar with a bottom surface of the trench in the second inter-level dielectric layers.

7 Claims, 10 Drawing Sheets

INDUCTOR MODULE AND METHOD FOR FABRICATING THE SAME

FIELD OF THE INVENTION

The present invention relates to an inductor module and a method for fabricating the inductor module.

BACKGROUND OF THE INVENTION

The miniaturization of electronic circuits has always been the goal of various application fields nowadays. The miniaturization can not only achieve the purpose of lightness, thinness and shortness, but also reduce manufacturing costs. Nowadays, many digital or analog circuits can be successfully constructed with silicon-based integrated circuits, and can be mass-produced by very large scale integrated (VLSI) technique.

However, there are still some electronic circuit miniaturization techniques in application field to be developed, such as the electronic circuit miniaturization techniques for radio frequency (RF) circuits used in mobile phones and other communication equipment. The main difficulty in miniaturizing RF circuits is how to produce high-quality inductance components (inductors) suitable for RF circuits. Designers of inductance components generally expect the inductance components to have a lower resistance value and a better quality factor (Q factor). Therefore, how to obtain an inductance component with a lower resistance value and a better quality factor under the premise of a miniature electronic component is eagerly pursued by the current industry.

SUMMARY OF THE INVENTION

The present invention provides an inductor module and a method for fabricating the inductor module, and the inductor module has a low resistance value and a high quality factor.

The inductor module provided by the present invention includes: a substrate, a first inter-level dielectric layer, a plurality of second inter-level dielectric layers, a trench, and a first metal layer. The first inter-level dielectric layer is disposed on the substrate. The plurality of second inter-level dielectric layers is sequentially stacked on the first inter-level dielectric layer. The trench is disposed to penetrate at least two of the second inter-level dielectric layers. The first metal layer is disposed in the trench. The first metal layer has a top side surface and a bottom side surface opposite to each other. The top side surface of the first metal layer is coplanar with an upper surface of the trench in the second inter-level dielectric layers. The bottom side surface of the first metal layer is coplanar with a bottom surface of the trench in the second inter-level dielectric layers.

In one embodiment of the present invention, the aforementioned inductor module further includes an etching stop layer disposed under a bottom of the trench and connected to the first metal layer.

In one embodiment of the present invention, the aforementioned inductor module further includes a semiconductor component and a second metal layer. The semiconductor component is disposed on the substrate and covered by the first inter-level dielectric layer, and located on a side of the trench and the first metal layer. The second metal layer is disposed in the most top plurality of second inter-level dielectric layer and electrically connected with the semiconductor component.

In one embodiment of the present invention, a thickness of the second metal layer is less than a thickness of the first metal layer, and a width of the first metal layer is greater than a width of the second metal layer.

In one embodiment of the present invention, the aforementioned inductor module further includes an etching stop layer and a first interconnect metal layer. The etching stop layer is disposed under a bottom of the trench and located in the first inter-level dielectric layer. The first interconnect metal layer is disposed on the first inter-level dielectric layer and electrically connected the second metal layer to the semiconductor component.

In one embodiment of the present invention, the aforementioned inductor module further includes at least one second interconnect metal layer and a plurality of plugs. The at least one second interconnect metal layer and the plurality of plugs are disposed in the plurality of second inter-level dielectric layers. The at least one second interconnect metal layer is electrically connected with the semiconductor component.

In one embodiment of the present invention, the aforementioned inductor module further includes an etching stop layer, a first interconnect metal layer, and at least one second interconnect metal layer. The etching stop layer is disposed under a bottom of the trench. The first interconnect metal layer is disposed on the first inter-level dielectric layer and electrically connected with the semiconductor component. The at least one second interconnect metal layer is electrically connected with the second metal layer to the first interconnect metal layer. The etching stop layer and one of the second interconnect metal layers are disposed in a same layer in the plurality of second inter-level dielectric layers.

In one embodiment of the present invention, an upper surface of the first metal layer is a spiral shape.

In one embodiment of the present invention, the aforementioned inductor module further includes two pads respectively disposed on two terminals of the spiral shape of the first metal layer.

In one embodiment of the present invention, the aforementioned inductor module further includes a spiral pad disposed on the spiral shape of the first metal layer.

The method for fabricating an inductor module provided by the present invention includes steps of: providing a substrate; forming a first inter-level dielectric layer on the substrate; forming a plurality of second inter-level dielectric layers on the first inter-level dielectric layer; forming a trench penetrating at least two of the second inter-level dielectric layers; and forming a first metal layer in the trench.

In one embodiment of the present invention, the aforementioned method for fabricating an inductor module further includes: forming an etching stop layer under a bottom of the trench and connected to the first metal layer.

In one embodiment of the present invention, the aforementioned method for fabricating an inductor module further includes: forming a semiconductor component on the substrate.

In one embodiment of the present invention, an upper surface of the first metal layer is a spiral shape.

In one embodiment of the present invention, the aforementioned method for fabricating an inductor module further includes: forming a first inter-level dielectric layer and the plurality of second inter-level dielectric layers on the semiconductor component.

In one embodiment of the present invention, the aforementioned method for fabricating an inductor module further includes: forming a first interconnect metal layer in the first inter-level dielectric, wherein the etching stop layer and the first interconnect metal layer are formed in the same process.

In the present invention, by sequentially forming the first inter-level dielectric layer and the second inter-level dielectric layers on the substrate, forming the trench which at least penetrates two of the second inter-level dielectric layers, disposing the first metal layer in the trench, and respectively connecting the two side surfaces of the first metal layer with the upper surface of the top-most second inter-level dielectric layer and the lower surface of the bottom-most second inter-level dielectric layer in the second inter-level dielectric layers penetrated by the trench, the first metal layer can have a thickness equal to the thickness of the at least two second inter-level dielectric layers, thereby achieving the advantages of reducing the resistance of the inductor module and improving the quality factor.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
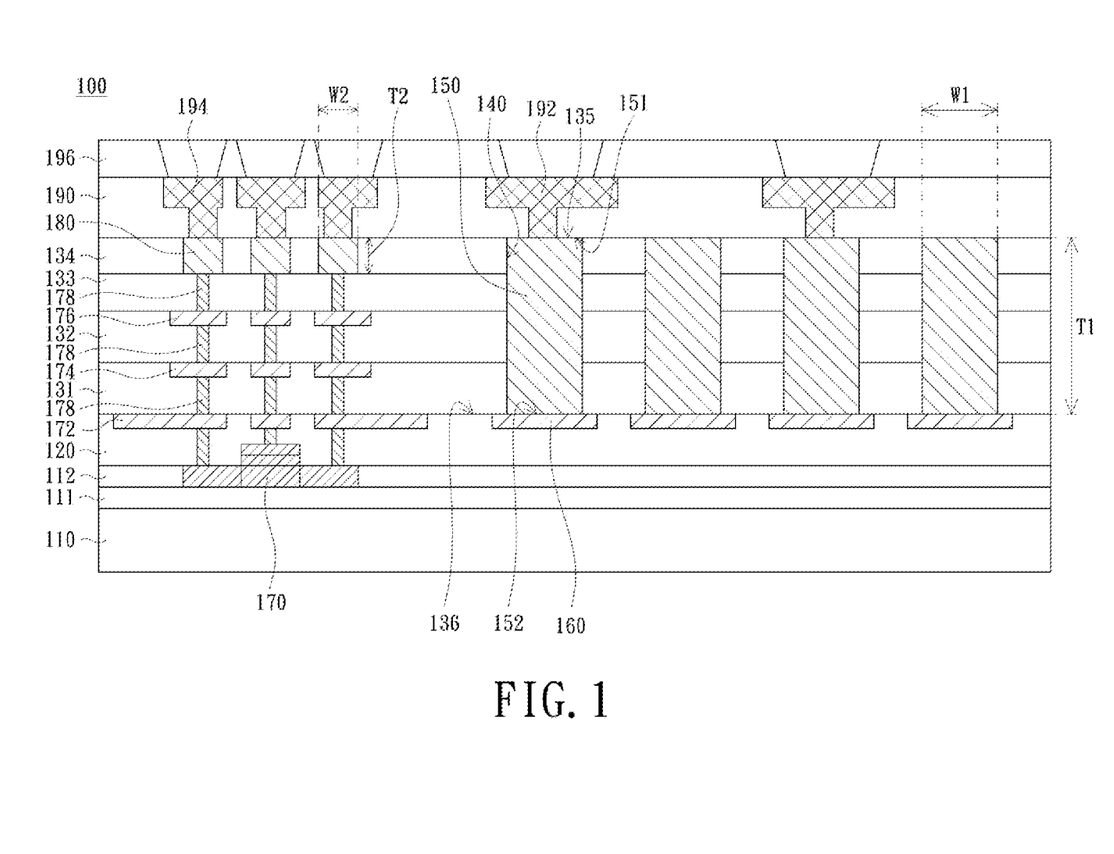
FIG. 1 is a schematic sectional view of an inductor module in accordance with an embodiment of the present invention.

FIG. 1 is a schematic sectional view of an inductor module in accordance with an embodiment of the present invention. As shown in FIG. 1, the inductor module 100 includes a substrate 110, a first inter-level dielectric layer 120, a plurality of second inter-level dielectric layers 131, 132, 133, 134, a trench 140, and a first metal layer 150. The first inter-level dielectric layer 120 is disposed on the substrate 110. The second inter-level dielectric layers 131, 132, 133, 134 are sequentially stacked on the first inter-level dielectric layer 120. The trench 140 is disposed to penetrate at least two of the second inter-level dielectric layers 131, 132, 133, 134, and the trench is forming straight to penetrate the at least two of the second inter-level dielectric layers. The first metal layer 150 is disposed in the trench 140. The first metal layer 150 has two opposite side surfaces, such as a top side surface 151 and a bottom side surface 152. The top side surface 151 of the first metal layer 150 is substantially coplanar with an upper surface of the trench 140 (that is, substantially coplanar with an upper surface 135 of the second inter-level dielectric layer 134 defined as the most top second inter-level dielectric layer in the second inter-level dielectric layers 131, 132, 133, 134 penetrated by the trench 140). The bottom side surface 152 of the first metal layer 150 is substantially coplanar with a bottom surface of the trench 140 (that is, substantially coplanar with a bottom surface 136 of the second inter-level dielectric layer 131 defined as the most bottom second inter-level dielectric layer in the second inter-level dielectric layers 131, 132, 133, 134 penetrated by the trench 140). The material of the first metal layer 150 is a low resistance material, such as but not limited to copper, aluminum, and gold. In addition, in the present embodiment, the quantity of the second inter-level dielectric layers 131, 132, 133, 134 is exemplified as four, but not limited thereto.

Figure 2:
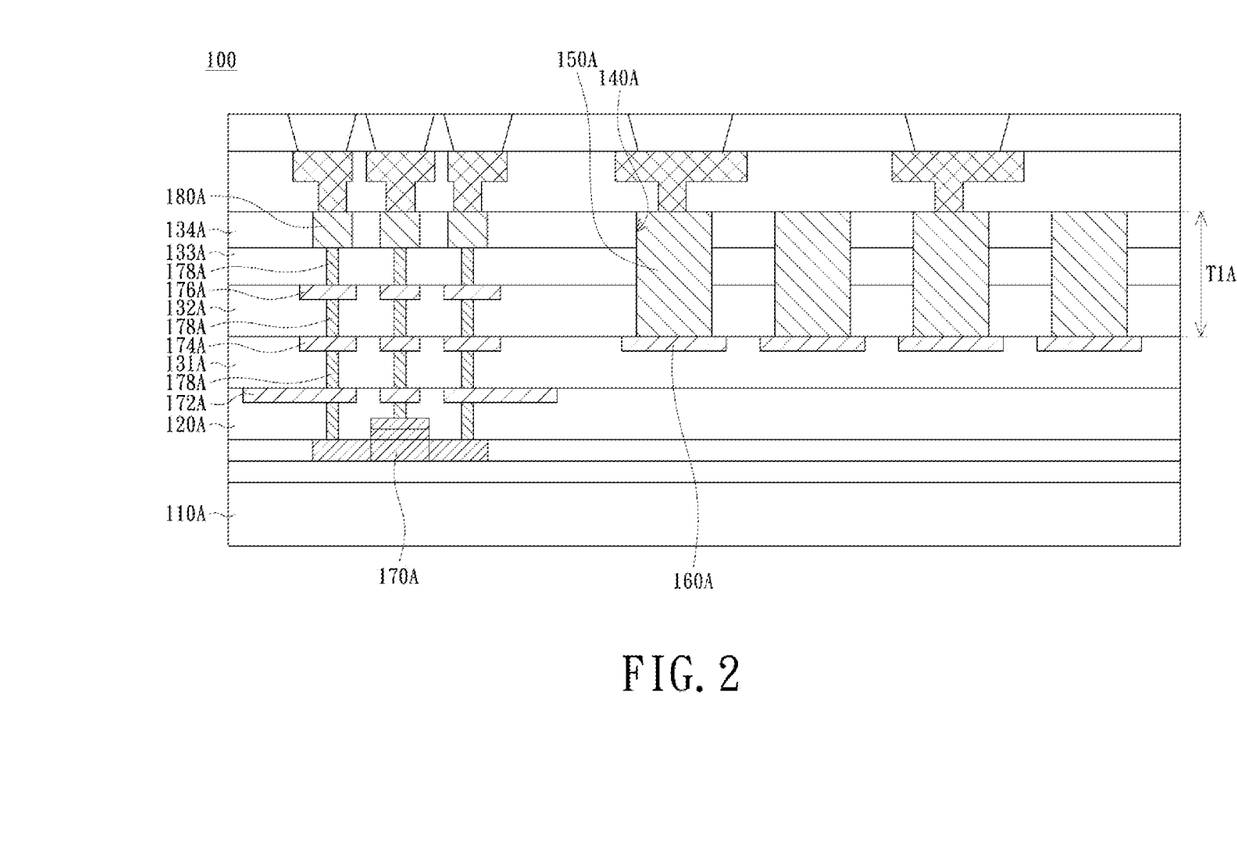
FIG. 2 is a schematic sectional view of an inductor module in accordance with another embodiment of the present invention.

The inductor module 100 may further include an etching stop layer 160. The etching stop layer 160 is disposed under the bottom of the trench 140 and connected with the first metal layer 150. Specifically, the bottom side surface 152 of the first metal layer 150 is connected with the etching stop layer 160. In the present embodiment, the trench 140 penetrates all the second inter-level dielectric layers 131, 132, 133, 134 by one time, that is, penetrates the four second inter-level dielectric layers 131, 132, 133, 134, and the trench 140 is forming straight in the four second inter-level dielectric layers 131, 132, 133, 134. The bottom side surface 152 of the first metal layer 150 is connected with the first inter-level dielectric layer 120 and the bottom surface 136 of the second inter-level dielectric layer 131, which is defined as the most bottom second inter-level dielectric layer in all the second inter-level dielectric layers 131, 132, 133, 134. The etching stop layer 160 is disposed in the first inter-level dielectric layer 120. Therefore, the depth of the trench 140 (i.e., the thickness T1 of the first metal layer 150) may be equal to the thickness of the four second inter-level dielectric layers 131, 132, 133, 134. In another embodiment as shown in FIG. 2, the trench 140A may penetrate only a part of the second inter-level dielectric layers 131A, 132A, 133A, 134A, such as penetrate the three second inter-level dielectric layers 132A, 133A, 134A. In this case, the etching stop layer 160A is disposed in the second inter-level dielectric layer 131A, which is defined as the most bottom second inter-level dielectric layer in all the second inter-level dielectric layers 131A, 132A, 133A, 134A. In addition, the depth of the trench 140A (i.e., the thickness T1A of the first metal layer 150A) may be equal to the thickness of the three second inter-level dielectric layers 132A, 133A, 134A. In other words, in the present invention, the depths of the trenches 140, 140A (i.e., the thicknesses T1, T1A of the first metal layers 150, 150A) can be precisely adjusted by controlling the positions of the etching stop layers 160, 160A. It should be understood that the etching stop layers 160, 160A help to accurately adjust the depths of the trenches 140, 140A to prevent the first metal layers 150, 150A from being too thick. However, the etching stop layers 160, 160A may not be required if the etching process is properly controlled or a lower etching depth (or thickness) accuracy is allowed.

The inductor module 100 may further include a semiconductor component 170 and a second metal layer 180. The semiconductor component 170 is disposed on the substrate 110. Specifically, the semiconductor component 170 is covered by the first inter-level dielectric layer 120 and located on a side of the trench 140 and the first metal layer 150. The second metal layer 180 is disposed in the second inter-level dielectric layer 134, which is defined as the most top second inter-level dielectric layer in the second inter-level dielectric layers 131, 132, 133, 134 and is electrically connected with the semiconductor component 170. The semiconductor component 170 is, for example but not limited to, a transistor. In the present embodiment, an insulating layer 111 and an isolation layer 112 may be disposed between the substrate 110 and the first inter-level dielectric layer 120. Specifically, the insulating layer 111 is formed on the substrate 110, the isolation layer 112 is disposed on the insulating layer 111, and the semiconductor component 170 is disposed in the insulating layer 111 and the isolation layer 112. The insulating layer 111 is, for example but not limited to, a buried oxide layer. The isolation layer 112 is, for example but not limited to, a shallow trench isolation layer.

In addition, the thickness T2 of the second metal layer 180 is less than the thickness T1 of the first metal layer 150, and the width W1 of the first metal layer 150 is greater than the width W2 of the second metal layer 180. Specifically, the width W1 of the first metal layer 150 can be more than twice the width W2 of the second metal layer 180. For example, the width W2 of the second metal layer 180 can be, but not limited to, 3 μm to 20 μm, and the thickness T2 of the second metal layer 180 can be, but not limited to, 7 μm. The material of the second metal layer 180 can be a low resistance material, such as copper, aluminum, and gold, but not limited thereto; and the material of the second metal layer 180 may be the same as the material of the first metal layer 150.

The thickness T1 of the first metal layer 150 can be increased as needed, so as to reduce the resistance of the inductor module 100 and improve the quality factor without increasing the width W1 of the first metal layer 150. On the other hand, the width W1 of the first metal layer 150 can also be increased as needed, so as to reduce the resistance of the inductor module 100 and improve the quality factor without increasing the thickness T1 of the first metal layer 150. In other words, the quality factor can be improved without excessively increasing the volume of the inductor module 100. Therefore, the inductor module 100 can meet the requirements of miniaturized radio frequency circuits for high quality factors.

The inductor module 100 may further include a first interconnect metal layer 172, second interconnect metal layers 174, 176, and a plurality of plugs 178. The first interconnect metal layer 172 is disposed in the first inter-level dielectric layer 120. The second interconnect metal layers 174, 176 and the plugs 178 are disposed in the second inter-level dielectric layers 131, 132, 133, 134. The second interconnect metal layers 174, 176 electrically connect the second metal layer 180 to the first interconnect metal layer 172 via the plugs 178. The first interconnect metal layer 172 electrically connects the second interconnect metal layers 174, 176 to the semiconductor component 170 via the plugs 178. In the present embodiment, the inductor module 100 has a plurality of second interconnect metal layers 174, 176.

The second interconnect metal layers 174, 176 are disposed in the second inter-level dielectric layers 131, 132 respectively, and the adjacent second interconnect metal layers 174, 176 are electrically connected with each other via the plug 178. The first interconnect metal layer 172 and the etching stop layer 160 both are disposed in the first inter-level dielectric layer 120. In another embodiment as shown in FIG. 2, the etching stop layer 160A and one of the second interconnect metal layers (e.g., second interconnect metal layer 174A) are disposed in the same second inter-level dielectric layer 131A. The design of disposing the first interconnect metal layer 172 and the etching stop layer 160 in the first inter-level dielectric layer 120 (FIG. 1) and the design of disposing the etching stop layer 160A and one of the second interconnect metal layers (e.g., second interconnect metal layer 174A) in the same second inter-level dielectric layer 131A (FIG. 2) allow the etching stop layers 160, 160A to be formed together with the first interconnect metal layer 172 or the second interconnect metal layers 174A, 176A in lithography and deposition processes, so as to help shorten the overall process steps and time. In addition, the materials of the etching stop layers 160, 160A may be the same as or different from the materials of the first interconnect metal layers 172, 172A and/or the materials of the second interconnect metal layers 174, 176, 174A, 176A. In addition, FIG. 2 is exemplified by disposing the etching stop layer 160A and the second interconnect metal layer 174A together in the second inter-level dielectric layer 131A; however, it should be understood that the etching stop layer 160A and the second interconnect metal layer 176A may be disposed together in the second inter-level dielectric layer 132A.

The inductor module 100 may further include a third inter-level dielectric layer 190, pads 192, 194, and a passive layer 196. The third inter-level dielectric layer 190 covers the most top second inter-level dielectric layer 134. The pads 192, 194 are disposed to penetrate the third inter-level dielectric layer 190 and are connected to the first metal layer 150 and the second metal layer 180, respectively. Specifically, the pads 192, 194 include a first pad 192 connected to the first metal layer 150 and a second pad 194 connected to the second metal layer 180. The passive layer 196 covers the third inter-level dielectric layer 190 and exposes the pads 192, 194.

Figure 3:
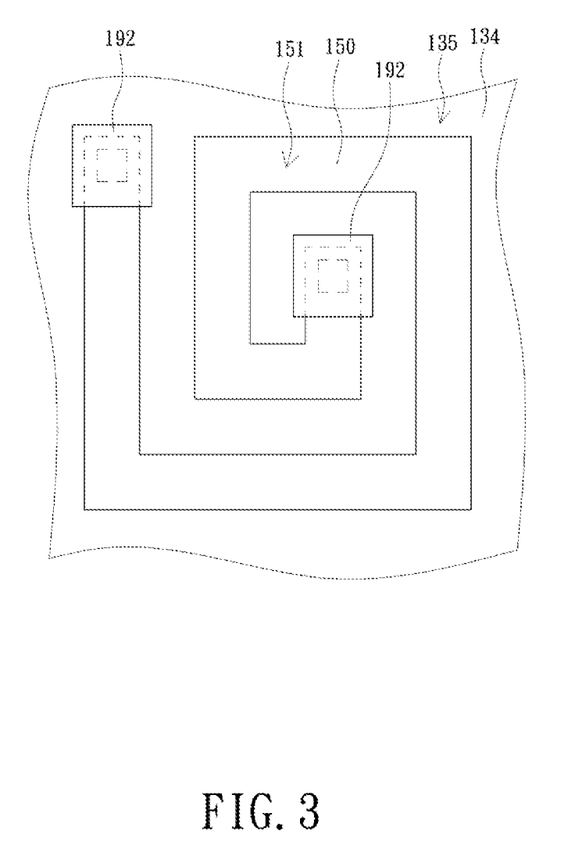
FIG. 3 is a schematic partial top view of the inductor module shown in FIG. 1, in which only a first metal layer, pads, and a most top second inter-level dielectric layer are shown.

FIG. 3 is a schematic partial top view of the inductor module shown in FIG. 1. As shown in FIGS. 1 and 3, the upper surface of the first metal layer 150 is a spiral shape; that is, the top side surface 151 of the first metal layer 150 is distributed in a spiral shape. In addition, the pad 192 is disposed on the two terminals of the spiral shape.

Figure 4:
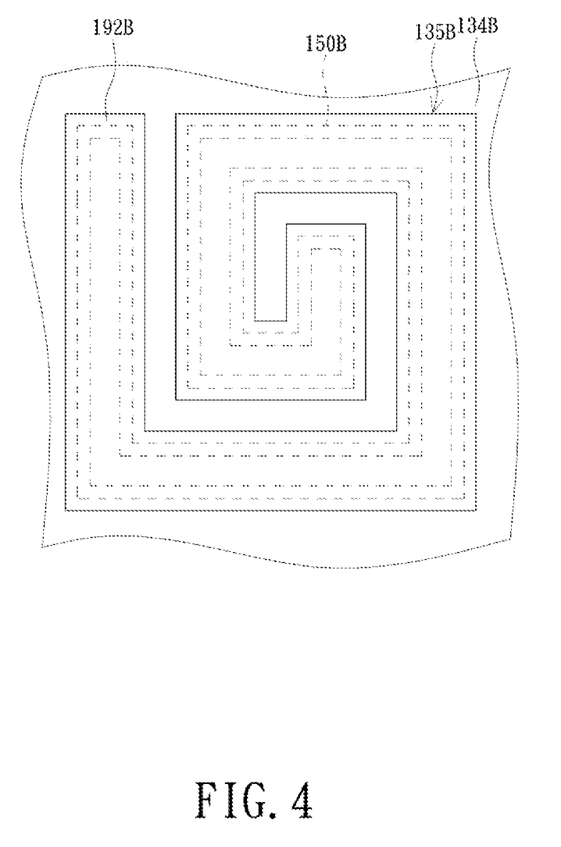
FIG. 4 is a schematic partial top view of an inductor module in accordance with an embodiment of the present invention, in which only a first metal layer, a pad, and a most top second inter-level dielectric layer are shown.

FIG. 4 is a schematic partial top view of an inductor module in accordance with an embodiment of the present invention. As shown in FIG. 4, the first metal layer 150B is distributed in a spiral shape on the upper surface 135B of the most top second inter-level dielectric layer 134B, the pad 192B is in a spiral shape, and the pad 192B is disposed along the spiral shape of the first metal layer 150B.

Figure 5:
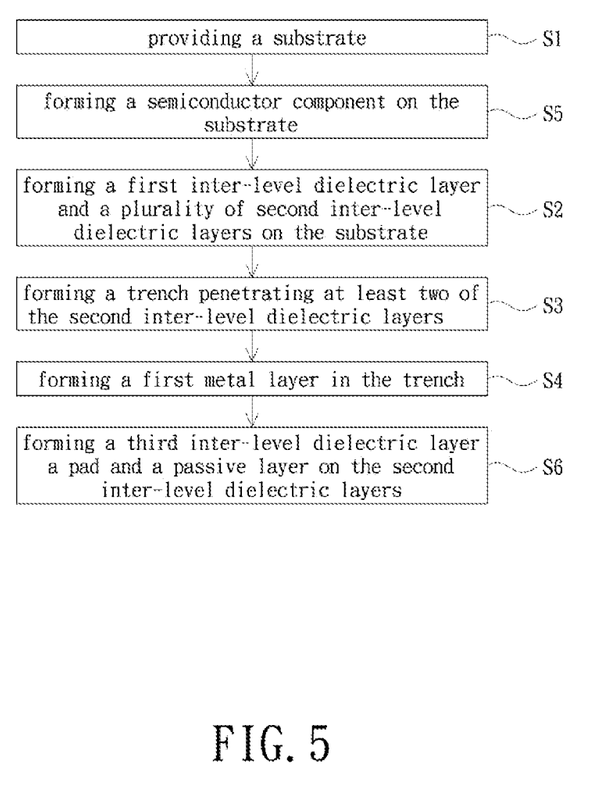
FIG. 5 is a flowchart of a method for fabricating an inductor module in accordance with an embodiment of the present invention.

FIG. 5 is a flowchart of a method for fabricating an inductor module in accordance with an embodiment of the present invention. FIGS. 6A to 6D are schematic sectional views for illustrating a method for fabricating an inductor module in accordance with an embodiment of the present invention.

As shown in FIG. 5, the method for fabricating the inductor module 100 includes the following steps. Step S1: providing a substrate 110; step S2: forming a first inter-level dielectric layer 120 and a plurality of second inter-level dielectric layers 131, 132, 133, 134 on the substrate 110; step S3: forming a trench 140 penetrating at least two of the second inter-level dielectric layers 131, 132, 133, 134; and step S4: forming a first metal layer 150 in the trench 140.

Figure 6A:
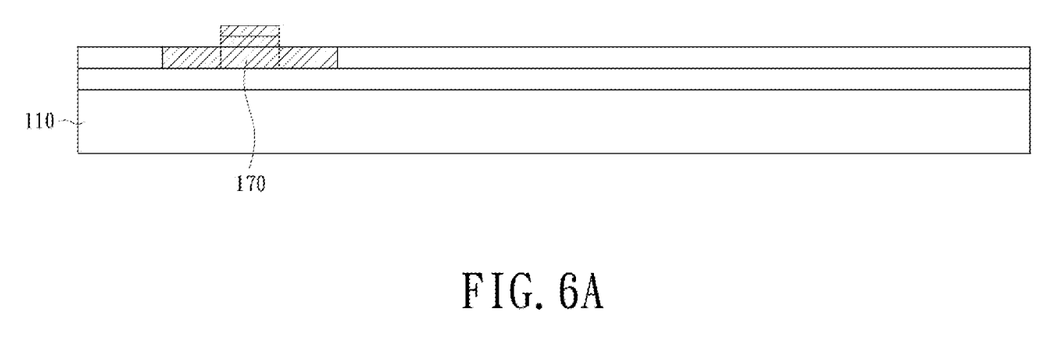
FIGS. 6A to 6D are schematic sectional views for illustrating a method for fabricating an inductor module in accordance with an embodiment of the present invention.

In step S1 as shown in FIG. 6A, the substrate 110 is provided. The substrate 110 may be, for example but not limited to, a silicon substrate, epitaxial silicon substrate, silicon germanium substrate, silicon carbide substrate, and silicon on insulation (SOI) substrate, but not limited thereto.

Figure 6B:
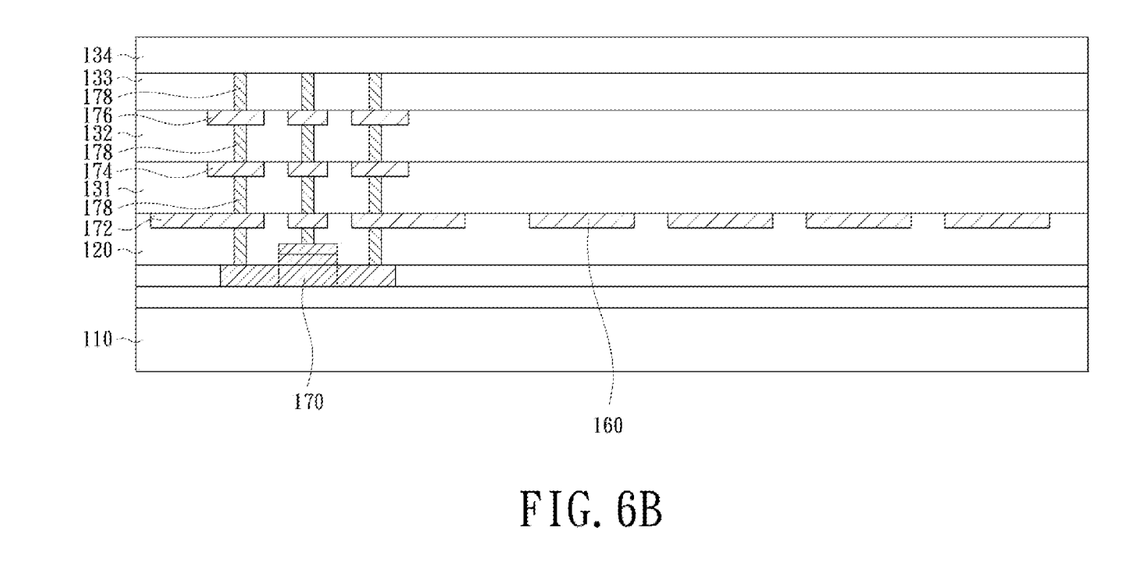

In step S2 as shown in FIG. 6B, the first inter-level dielectric layer 120 is disposed on the substrate 110, and the second inter-level dielectric layers 131, 132, 133, 134 are sequentially stacked on the first inter-level dielectric layer 120. In the present embodiment, the first inter-level dielectric layer 120 and the second inter-level dielectric layers 131, 132, 133, 134 may be formed by, for example but not limited to, chemical vapor deposition process. The detailed flow of step S2 will be illustrated in FIG. 7.

Figure 6C:
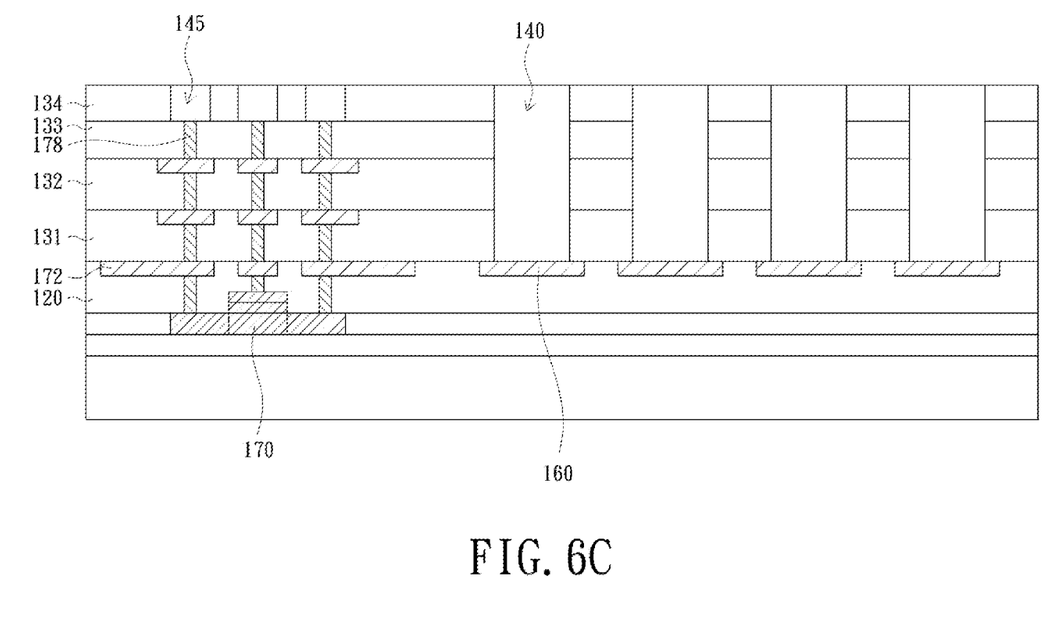

In step S3 as shown in FIG. 6C, at least two of the second inter-level dielectric layers 131, 132, 133, 134 are penetrated to form the trench 140. In the present embodiment, at least two of the second inter-level dielectric layers 131, 132, 133, 134 are etched by a plasma etching to form the trench 140 penetrating the second inter-level dielectric layers 131, 132, 133, 134.

Figure 6D:
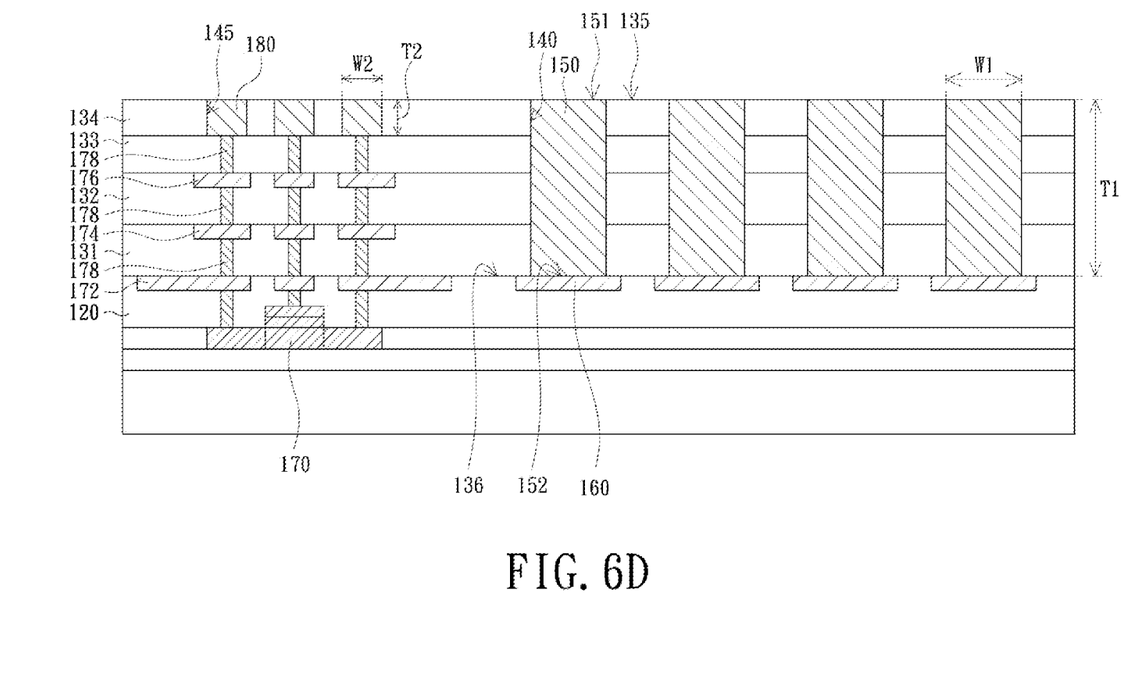

In step S4 as shown in FIG. 6D, the first metal layer 150 is formed in the trench 140. The first metal layer 150 has a top side surface 151 and a bottom side surface 152 opposite to each other. The top side surface 151 of the first metal layer 150 is substantially coplanar with an upper surface of the trench 140 (that is, substantially coplanar with an upper surface 135 of the second inter-level dielectric layer 134 defined as the most top second inter-level dielectric layer in the second inter-level dielectric layers 131, 132, 133, 134 penetrated by the trench 140). The bottom side surface 152 of the first metal layer 150 is substantially coplanar with a bottom surface of the trench 140 (that is, substantially coplanar with a bottom surface 136 of the second inter-level dielectric layer 131 defined as the most bottom second inter-level dielectric layer in the second inter-level dielectric layers 131, 132, 133, 134 penetrated by the trench 140). In the present embodiment, the first metal layer 150 is formed in the trench 140 by a deposition process. The deposition process is, for example but not limited to, a conformal deposition.

As shown in FIG. 6B, step S2 may further include: forming an etching stop layer 160 on the substrate 100. The etching stop layer 160 is formed by, for example but not limited to, a lithography process and a deposition process. In step S3 as shown in FIG. 6C, at least two of the second inter-level dielectric layers 131, 132, 133, 134 are penetrated to the etching stop layer 160 to form the trench 140, and therefore a bottom of the trench 140 is connected with the etching stop layer 160. In step S4 as shown in FIG. 6D, the first metal layer 150 is formed in the trench 140 and is connected to the etching stop layer 160.

As shown in FIG. 5, the method for fabricating the inductor module may further include a step S5 between step S1 and step S2. Step S5: forming a semiconductor component 170 on the substrate 110.

In step S5 as shown in FIG. 6A, the semiconductor component 170 is formed on the substrate 110 by a semiconductor manufacturing process. In step S2 as shown in FIG. 6B, the first inter-level dielectric layer 120 and the second inter-level dielectric layers 131, 132, 133, 134 are disposed on the substrate 110 and the semiconductor component 170. The first inter-level dielectric layer 120 covers the substrate 110 and the semiconductor component 170. The second inter-level dielectric layers 131, 132, 133, 134 are sequentially stacked on the first inter-level dielectric layer 120. Step S3 as shown in FIG. 6C may further include: forming a recess 145. The most top second inter-level dielectric layer 134 in the four second inter-level dielectric layers 131, 132, 133, 134 is penetrated to form the recess 145. The location of the recess 145 and the location of the trench 140 are spaced with each other. Step S4 as shown in FIG. 6D may further include: forming a second metal layer 180. The second metal layer 180 is formed in the recess 145. The second metal layer 180 is substantially coplanar with the upper surface 135 of the most top second inter-level dielectric layer 134 in the four second inter-level dielectric layers 131, 132, 133, 134 and is electrically connected with the semiconductor component 170.

As shown in FIG. 5, the method for fabricating the inductor module 100 may further include step S6: forming a third inter-level dielectric layer 190, pads 192, 194 and a passive layer 196 on the second inter-level dielectric layers 131, 132, 133, 134.

In step S6 as shown in FIGS. 1 and 6D, the third inter-level dielectric layer 190 is first formed on the most top second inter-level dielectric layer 134; next, the pads 192, 194 are disposed to penetrate the third inter-level dielectric layer 190 and are connected with the first metal layer 150 and the second metal layer 180; then, the passive layer 196 exposing the pads 192, 194 is formed on the third inter-level dielectric layer 190. In the present embodiment, the third inter-level dielectric layer 190 is formed by, for example but not limited to, a chemical vapor deposition process. The arrangement positions of the pads 192, 194 on the third inter-level dielectric layer 190 may be defined by, for example, a lithography process in advance.

Figure 7:
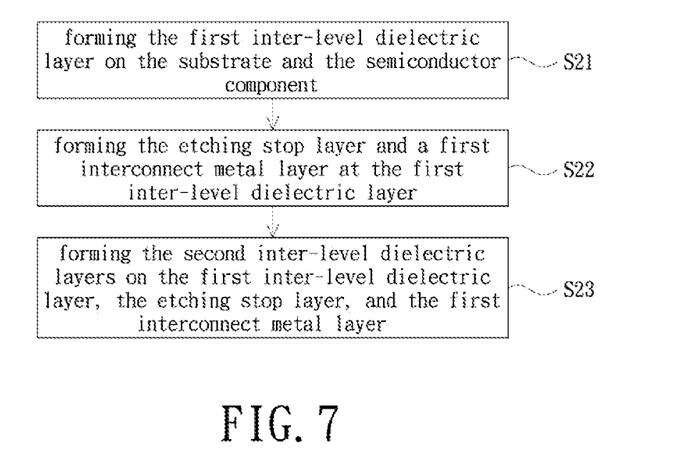
FIG. 7 is a detailed flowchart for step S2 of the method for fabricating the inductor module in accordance with an embodiment of the present invention.

FIG. 7 is a detailed flowchart for step S2 of the method for fabricating the inductor module in accordance with an embodiment of the present invention. As shown in FIG. 7, step S2 may include the following steps. Step S21: forming the first inter-level dielectric layer on the substrate and the semiconductor component; step S22: forming the etching stop layer and a first interconnect metal layer in the first inter-level dielectric layer; and step S23: forming the second inter-level dielectric layers on the first inter-level dielectric layer, the etching stop layer, and the first interconnect metal layer. The detailed flow of step S2 shown in FIG. 7 will be described below together with FIG. 6B.

As shown in FIG. 6B, in step S21, the first inter-level dielectric layer 120 covers the substrate 110 and the semiconductor component 170. In step S22, the etching stop layer 160 and the first interconnect metal layer 172 are formed at different positions on the first inter-level dielectric layer 120, that is, the etching stop layer 160 and the first interconnect metal layer 172 are disposed and spaced with each other on the first inter-level dielectric layer 120. The etching stop layer 160 and the first interconnect metal layer 172 are formed by, for example but not limited to, a lithography process and a deposition process. In step S23, the second inter-level dielectric layers 131, 132, 133, 134 are formed on the first inter-level dielectric layer 120, the etching stop layer 160, and the first interconnect metal layer 172. Specifically, the most bottom second inter-level dielectric layer 131 covers the first inter-level dielectric layer 120, the etching stop layer 160, and the first interconnect metal layer 172. The rest second inter-level dielectric layers 132, 133, 134 are sequentially stacked on the most bottom second inter-level dielectric layer 131. In addition, in steps S3 and S4 as shown in FIGS. 6C and 6D, the bottom of the trench 140 is connected with the etching stop layer 160, the first metal layer 150 is connected with the first inter-level dielectric layer 120 via the etching stop layer 160, and the second metal layer 180 is electrically connected with the semiconductor component 170 via the first interconnect metal layer 172.

Step S23 as shown in FIG. 6B may further include: forming second interconnect metal layers 174, 176 and a plurality of plugs 178 in the second inter-level dielectric layers 131, 132, 133, 134. The plugs 178 electrically connect the second interconnect metal layers 174, 176 to the first interconnect metal layer 172. In step S3 as shown in FIG. 6C, the bottom surface of the recess 145 is substantially coplanar with the top surface of the plugs 178. In step S4 as shown in FIG. 6D, the second metal layer 180 is formed in the recess 145 and is connected with the plug 178, and the second metal layer 180 is electrically connected with the first interconnect metal layer 172 via the plugs 178 and the second interconnect metal layers 174, 176.

In addition, in step S3 of the present embodiment, the depth of the trench 140 is greater than the depth of the recess 145, and the diameter of the trench 140 is greater than the diameter of the recess 145. In step S4, the thickness T2 of the second metal layer 180 is less than the thickness T1 of the first metal layer 150, and the width W1 of the first metal layer 150 is greater than the width W2 of the second metal layer 180. Furthermore, in the present embodiment, the trench 140 penetrates all the second inter-level dielectric layers 131, 132, 133, 134, that is, penetrates the four second inter-level dielectric layers 131, 132, 133, 134. The bottom side surface 152 is substantially coplanar with the first inter-level dielectric layer 120 and the bottom surface 136 of the most bottom second inter-level dielectric layer 131 in all the four second inter-level dielectric layers 131, 132, 133, 134. The etching stop layer 160 is disposed on the first inter-level dielectric layer 120. Therefore, the depth of the trench 140 (i.e., the thickness T1 of the first metal layer 150) may be equal to the thickness of the four second inter-level dielectric layers 131, 132, 133, 134. The recess 145 penetrates the most top second inter-level dielectric layer 134, that is, penetrates one second inter-level dielectric layer 134. Therefore, the depth of the recess 144 (i.e., the thickness T2 of the second metal layer 180) may be equal to the thickness of one second inter-level dielectric layer 134.

In addition, in step S3 of the present embodiment, the etching positions and ranges of the plasma etching process on the second inter-level dielectric layers 131, 132, 133, 134 are predetermined by a lithography process, so as to determine the widths of the trench 140, the recess 145, the first metal layer 150, and the second metal layer 180.

Figure 8:
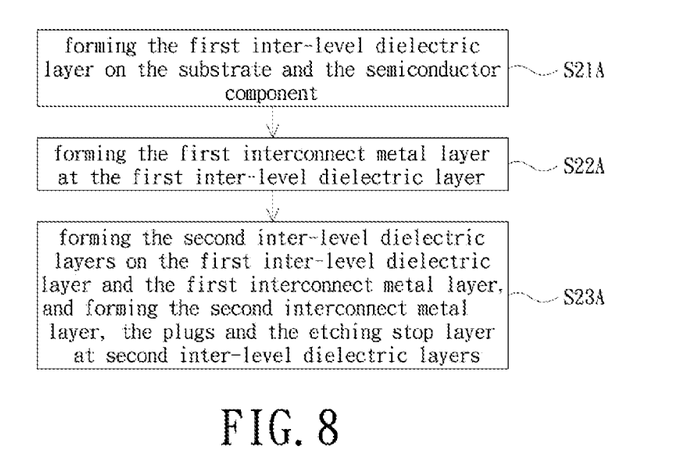
FIG. 8 is a detailed flowchart for step S2 of the method for fabricating the inductor module in accordance with another embodiment of the present invention.

FIG. 8 is a detailed flowchart for step S2 of the method for fabricating the inductor module in accordance with another embodiment of the present invention. As shown in FIG. 8, step S2 may include the following steps. Step S21A: forming the first inter-level dielectric layer on the substrate and the semiconductor component; step S22A: forming the first interconnect metal layer in the first inter-level dielectric layer; and step S23A: forming the second inter-level dielectric layers on the first inter-level dielectric layer and the first interconnect metal layer, and forming the second interconnect metal layer, the plurality of plugs and the etching stop layer in the second inter-level dielectric layers. The detailed flow of step S2 shown in FIG. 8 will be described below with the inductor module 100A shown in FIG. 2.

As shown in FIG. 2, in step S22A, the first interconnect metal layer 172A is formed on the first inter-level dielectric layer 120A. The first interconnect metal layer 172A can be formed by, for example but not limited to, a lithography process and a deposition process. In step S23A, the second inter-level dielectric layers 131A, 132A, 133A, 134A are formed on the first inter-level dielectric layer 120A and the first interconnect metal layer 172A; the second interconnect metal layer 174A, the plugs 178A and the etching stop layer 160A are disposed in the second inter-level dielectric layer 131A; and only the plugs 178A or both the second interconnect metal layer 176A and the plugs 178A are disposed in the rest second inter-level dielectric layers 132A, 133A (except the most top second inter-level dielectric layer 134A). Specifically, the etching stop layer 160A and one of the second interconnect metal layers 174A, 176A are arranged at intervals at the same layer in the second inter-level dielectric layers 131A, 132A, and the plugs 178A are arranged as needed to achieve the electrical connection between the semiconductor component 170A and the second metal layer 180A with the second interconnect metal layers 174A, 176A and the first interconnect metal layer 172A. In addition, in steps S3 and S4, the bottom of the trench 140A is connected with the etching stop layer 160A, the second metal layer 180A is electrically connected with the first interconnect metal layer 172A via the plugs 178A and the second interconnect metal layers 174A, 176A, so as to be electrically connected to the semiconductor component 170A.

In the inductor module and the method for fabricating the inductor module according to the embodiments of the present invention, by sequentially forming the first inter-level dielectric layer and the second inter-level dielectric layers on the substrate, forming the trench which penetrates at least two of the second inter-level dielectric layers, disposing the first metal layer in the trench, and making the two side surfaces of the first metal layer substantially coplanar with the upper surface of the trench and the bottom surface of the trench respectively, the first metal layer can have a thickness equal to the thickness of the at least two second inter-level dielectric layers, thereby reducing the resistance of the inductor module and improving the quality factor. In addition, the present invention can improve the quality factor without excessively increasing the volume of the inductor module. Therefore, the present invention meets the requirements of miniaturized radio frequency circuits for high quality factors.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An inductor module, comprising:
a substrate;
a first inter-level dielectric layer, disposed on the substrate;
a plurality of second inter-level dielectric layers, sequentially stacked on the first inter-level dielectric layer;
a trench, disposed to penetrate at least two of the second inter-level dielectric layers;
a first metal layer, disposed in the trench, wherein the first metal layer has a top side surface and a bottom side surface opposite to each other, the top side surface of the first metal layer is coplanar with an upper surface of the trench in the second inter-level dielectric layers, and the bottom side surface of the first metal layer is coplanar with a bottom surface of the trench in the second inter-level dielectric layers, wherein the top side surface of the first metal layer is a spiral shape; and a spiral pad, disposed on and along the spiral shape of the first metal layer, wherein a top side surface area of the spiral pad is larger than a top side surface area of the spiral shape of the first metal layer.

2. The inductor module according to claim 1, further comprising an etching stop layer disposed under a bottom of the trench and connected to the first metal layer.

3. The inductor module according to claim 1, further comprising:

a semiconductor component, disposed on the substrate and covered by the first inter-level dielectric layer, and located on a side of the trench and the first metal layer; and a second metal layer, disposed in the most top plurality of second inter-level dielectric layer and electrically connected with the semiconductor component.

4. The inductor module according to claim 3, wherein a thickness of the second metal layer is less than a thickness of the first metal layer, and a width of the first metal layer is greater than a width of the second metal layer.

5. The inductor module according to claim 3, further comprising an etching stop layer and a first interconnect metal layer, wherein the etching stop layer is disposed under a bottom of the trench and located in the first inter-level dielectric layer, and the first interconnect metal layer is disposed on the first inter-level dielectric layer and electrically connected the second metal layer to the semiconductor component.

6. The inductor module according to claim 5, further comprising at least one second interconnect metal layer and a plurality of plugs, wherein the at least one second interconnect metal layer and the plurality of plugs are disposed in the plurality of second inter-level dielectric layers, and the at least one second interconnect metal layer is electrically connected with the semiconductor component.

7. The inductor module according to claim 3, further comprising an etching stop layer, a first interconnect metal layer, and at least one second interconnect metal layer, wherein the etching stop layer is disposed under a bottom of the trench, the first interconnect metal layer is disposed on the first inter-level dielectric layer and electrically connected with the semiconductor component, and the at least one second interconnect metal layer is electrically connected with the second metal layer to the first interconnect metal layer, and the etching stop layer and one of the second interconnect metal layers are disposed in a same layer in the plurality of second inter-level dielectric layers.

* * * * *